(12) United States Patent
Dhogale

(10) Patent No.: US 9,171,594 B2
(45) Date of Patent: Oct. 27, 2015

(54) HANDLING COLLISIONS BETWEEN ACCESSES IN MULTIPORT MEMORIES

(75) Inventor: Vivek Dhogale, Cambridge (GB)

(73) Assignee: ARM Limited, Cambridge (GB)

( * ) Notice: Subject to any disclaimer, the term of this patent is extended or adjusted under 35 U.S.C. 154(b) by 492 days.

(21) Appl. No.: 13/553,156

(22) Filed: Jul. 19, 2012

(65) Prior Publication Data

US 2014/0025902 A1     Jan. 23, 2014

(51) Int. Cl.
| | |
|---|---|
| G06F 12/00 | (2006.01) |
| G11C 7/10 | (2006.01) |
| G11C 8/18 | (2006.01) |
| G06F 12/08 | (2006.01) |
| G11C 7/12 | (2006.01) |
| G11C 8/16 | (2006.01) |

(52) U.S. Cl.
CPC ............... *G11C 7/1075* (2013.01); *G11C 8/18* (2013.01); *G06F 12/0853* (2013.01); *G11C 7/12* (2013.01); *G11C 8/16* (2013.01)

(58) Field of Classification Search
CPC .......... G11C 7/1075; G11C 8/16; G11C 7/12; G06F 12/00
See application file for complete search history.

(56) References Cited

U.S. PATENT DOCUMENTS

| | | | | |
|---|---|---|---|---|
| 5,335,199 | A | * | 8/1994 | Aoyama ................. 365/230.05 |
| 7,363,436 | B1 | * | 4/2008 | Yeh et al. ...................... 711/149 |
| 2005/0180254 | A1 | * | 8/2005 | Tobescu et al. ............... 365/233 |
| 2008/0316851 | A1 | * | 12/2008 | Kinoshita et al. ........ 365/230.05 |
| 2009/0129194 | A1 | * | 5/2009 | New et al. ................ 365/230.05 |
| 2014/0269016 | A1 | * | 9/2014 | Pelley .......................... 365/154 |

FOREIGN PATENT DOCUMENTS

EP        1132820 A2 * 9/2001

* cited by examiner

*Primary Examiner* — Christian P Chace
*Assistant Examiner* — Eric Loonan
(74) *Attorney, Agent, or Firm* — Pramudji Law Group PLLC; Ari Pramudji

(57) ABSTRACT

A multiport memory having an array of storage cells for storing data; a plurality of data access ports; and access control circuitry to assign each data access port to one of the sets of access control lines and corresponding data lines. The control circuitry has collision detection circuitry to detect a colliding data access request received at a second data access port that requests access to a row of storage cells currently being accessed by a data access request received at a first data access port. The control circuitry is responsive to the detected collision to assign the set of access control lines and corresponding data lines currently assigned to the first data access port to the second data access port and to subsequently assign the first data access port to the set of access control lines and corresponding data lines previously assigned to the second access port.

18 Claims, 17 Drawing Sheets

HANDLING COLLISIONS BETWEEN ACCESSES IN MULTIPORT MEMORIES

TECHNICAL FIELD

The technical field relates to the field of multiport memories. More particularly, embodiments of the invention relate to mechanisms for mitigating potential problems associated with collisions occurring between concurrent data accesses from different memory ports.

BACKGROUND

Memories for storing data to be accessed by processors are known. Memories that are accessible by multiple processors are a convenient way of both storing data and passing data between the processors. In order for different processors to be able to access the same memory at the same time, memories with dual ports have been designed. These memories have two pairs of bit lines and two word lines for each bit cell, each port controlling a respective word line and pair of bit lines. Thus, a memory access at one port will activate one of the two word lines and this will cause the bit cells on that row to connect to the pair of bit lines associated with that port. A memory access to the other port will activate the other word line which will connect the other pair of bit lines to the bit cells on that row. In this way where different rows are accessed at a same time data from bit cells on the same column can be accessed via the respective bit lines.

Where different processors are accessing the same memory their clocks may not be aligned with each other and thus, the data accesses to the different ports may occur asynchronously. Whilst the use of multiport, for example dual port memories, may in many circumstances be advantageous they do give rise to certain difficulties.

Memory access collisions may occur if the same row is accessed from two ports at the same time. The processor logic will generally not allow the same cells to be accessed at the same time if one of the accesses is a write, however, different cells in the same row may be accessed and as access is controlled by the word line, both of the word lines to the one row may be turned on at the same time which will connect both sets of bit lines to the bit cells of that row. This means that if for example, one of the data accesses is a write, the value driven on the bit lines associated with that port will need to flip a bit cell which is also connected to another set of bit lines that are initially charged and thus, the parasitic capacitance of these bit lines will need to be overcome. This can cause a write failure.

US20009/0129194 assigned to ARM Limited of Cambridge UK, the entire contents of which are hereby incorporated by reference, discloses a multiport memory that provides control circuitry and override circuitry to identify read or write collisions and in response to detecting a collision actively drives both sets of bit lines with the value to be written thereby reducing the probability of a write failure occurring in response to a collision.

SUMMARY

A first aspect provides a multiport memory comprising:
an array of storage cells for storing data, each storage cell comprising data storage circuitry and a plurality of access control devices for isolating said storage circuitry from or connecting said storage circuitry to a data line, said memory comprising a plurality of sets of access control lines and corresponding data lines, each set of access control lines controlling one of said plurality of access control devices for each of said storage cells, said data lines each being coupled to a column of said storage cells and said access control lines each being coupled to a row of said storage cells;
a plurality of data access ports;
access control circuitry configured to assign each data access port to one of said sets of access control lines and corresponding data lines;
said access control circuitry comprising collision detection circuitry configured to detect a colliding data access request received at a second data access port that requests access to a row of storage cells currently being accessed by a data access request received at a first data access port;
said access control circuitry being responsive to said detected collision to assign said set of access control lines and corresponding data lines currently assigned to said first data access port to said second data access port and following completion of said data access request received at said first data access port to subsequently assign said first data access port to said set of access control lines and corresponding data lines previously assigned to said second access port.

The present technology described herein recognises that the problem of colliding data accesses can be addressed without connecting multiple data lines to a storage cell, by the use of dynamic port mapping. Where a colliding access is detected it is routed to the same access control line and data lines as the access that it collides with. Thus, two data access requests from different ports can share an access control line, which is fine as although the same row is being accessed, other circuitry in the processors will have ensured that the two access requests will either be accessing different storage cells on the row and/or they will both be reads and therefore they will not disturb the data accessed by the other request. As one of the access requests will have been received first, in order not to delay a subsequent access request at that port, it is assigned to the access control lines and data lines of the later access request that collided with it for the subsequent data access request and thus, this subsequent request is not delayed by the later colliding request using the data lines and access control lines that were previously assigned to this port.

Although US 2009/0129194 has addressed the problem of write failures associated with two data accesses accessing a same row by driving both bit lines this has the disadvantage of increased capacitance associated with the cell which reduces the speed of the access and increases the power required. Furthermore, connecting two bit lines to a storage cell will increase the noise added to the cell which can increase the probability of an access disturb. The present invention provides an alternative solution to this problem that has the advantage of not requiring two bit lines to be connected to the cell and therefore the detrimental effects associated with this on speed, performance and access disturb margin do not arise. This in turn allows for smaller devices in the storage cells and therefore a lower memory area In some embodiments, said access control circuitry is configured to assign said data access ports to one of said sets of access control lines and corresponding data lines at a start of a data access cycle.

Although the data access ports can be assigned to the appropriate set of access control lines and corresponding data lines at any time provided it is before the data access occurs, it is convenient if it is performed, particularly in the case of the second data access at the start of the data access cycle as in this way the assignment occurs just as it is needed and the data lines and access control lines can be selected at the appropriate point. The port for a following first data access may be reassigned when the first data access has completed.

In some embodiments, said access control circuitry further comprises indicator storage circuitry for storing an indicator value for each data access port indicating which of said sets of data lines and corresponding access control lines is currently assigned to said data access port.

A convenient way of indicating and controlling which data access port should use which data lines and access control lines is by the use of indicator values. These can be updated when the assignment changes and provide both information on and control of which access port is currently assigned to which set of lines.

In some embodiments, said access control circuitry is configured in response to a data access request received at one of said data access ports to update said indicator value for said data access port in response to said collision detection circuitry indicating said data access request is a colliding data access request.

A convenient way of controlling the assignment of the data access port is to update the indicator values in response to detecting a colliding data access request. In this way, the data access port receiving the colliding data access request can have its indicator value updated to that of the data access port that is processing the request that it collides with. When that request has finished its indicator value can be updated with the value that was previously held for this data access port.

In some embodiments, said memory is a dual port memory and comprises:

first and second data access ports and first and second sets of access control lines and data lines;

wherein said indicator storage circuitry further comprises a global indicator bit configured to toggle in response to said collision detection circuitry detecting a colliding data access request, a first value of said global indicator bit indicating said first and second data access ports are to be assigned to said first and second sets of access control lines and corresponding data lines and a second value of said global indicator bit indicating said first and second data access ports are to be assigned to said second and first sets of access control lines and corresponding data lines respectively;

wherein said access control circuitry is configured in response to a data access request received at one of said data access ports to set said indicator value for said data access port with a current value of said global indicator bit and to latch said value such that mapping for said data access port does not change until said data access request is complete.

In the case that the memory is a dual port memory, then a global indicator bit can be used which toggles when a collision is detected. The value of the global indicator bit indicates which port should be assigned to which set of access control lines and data lines. At the start of a data access request, an indicator value for the data access port of the access request can be set to the current value of the global indicator bit and this value can then be latched so that the mapping for the data access port does not change until said data access request is complete. In this way, control of the assignment of the access control lines and data lines to the respective ports can be made in an efficient manner that avoids collision while allowing access requests to be processed without undue delay and without an undue amount of circuitry.

In some embodiments, said access control circuitry further comprises first and second latching circuitry associated with each port, said first and second latching circuitry configured to latch an indicator value indicating which of said access control lines and corresponding bit lines are to be assigned to said port in response to a signal indicating a start of a data access at said port, said first and second latching circuitry being configured to output a stored latch value from different output ports, such that one of said first and second latching circuitry outputs a stored value and an other of said first and second latching circuitry outputs an inverted stored value.

The access control circuitry may have two latching circuits, one of the two latching circuits outputting a value stored and the other the inverted value stored. The two latching circuits are updated with the indicator value indicating the access control line and data lines for a port to use and are latched in response to a signal indicating a start of a data access at that port. By having two latch circuits that output either a stored value or an inverted stored value of the indicator, where it is known that the indicator value will have toggled for an access, the inverted value to that usually used can be used as the control value and in this way the circuit does not need to wait for the toggled value to reach the latch and be latched. This can improve access times.

In some embodiments, the multiport memory further comprises override circuitry for detecting colliding data access requests received at two of said data access ports and whose data access cycles start within a predetermined time of each other, said data access circuitry being responsive to said colliding detection circuitry detecting a colliding access and said override circuitry not detecting simultaneous data accesses to select said access control lines in response to said indicator value stored in said first latching circuitry and in response to said colliding detection circuitry not detecting a colliding access to select said access control lines in response to said indicator value stored in said second latching circuitry.

Where there are colliding data access requests that are not received simultaneously within a certain period of time of each other then the first latching circuitry that outputs an inverted value compared to the second latching circuitry can be used to select the data access control lines as one knows that the global bit will have toggled since the last access at this port. This allows the access to commence immediately without waiting for the toggled indicator bit to be latched.

In some embodiments, said multiport memory further comprises override circuitry for detecting colliding data access requests received at two data access ports and whose data access cycles start within a predetermined time of each other, said override circuitry being configured to assign both of said two data access ports to a predetermined access control line and corresponding data lines.

Where colliding data access requests are received and they do start within a predetermined time of each other then override circuitry can override the indicator values and assign both of the data access ports that receive the colliding data access requests to a same predetermined access control line and corresponding data lines irrespective of the value stored in the indicator values stores. This enables the assignment to be performed quickly without waiting for the global indicator value to attain its value for that cycle.

In some embodiments, said multiport memory further comprises override circuitry for detecting colliding data access requests received at two data access ports and whose data access cycles start within a predetermined time of each other, said override circuitry being configured in response to detecting said simultaneous colliding data accesses to inhibit said global indicator bit from toggling. In addition to selecting the predetermined access control lines and ignoring the indicator value the global indicator may also be inhibited from toggling when simultaneous data access requests are received. As a predetermined access control line and data lines are used for the colliding access it is unimportant what value the global indicator has and thus, there is no need to toggle it.

A second aspect provides a method of accessing data within a multiport memory having:

an array of storage cells for storing data, each storage cell comprising data storage circuitry and a plurality of access control devices for isolating said storage circuitry from or connecting said storage circuitry to a data line, said memory comprising a plurality of sets of access control lines and corresponding data lines, each set of access control lines controlling one of said plurality of access control devices for each of said storage cells, said data lines each being coupled to a column of said storage cells and said access control lines each being coupled to a row of said storage cells; and a plurality of data access ports; comprising the steps of:

assigning each data access port to one of said sets of access control lines and corresponding data lines;

detecting a colliding data access request received at a second data access port that requests access to a row of storage cells currently being accessed by a data access request received at a first data access port;

in response to said detected colliding data access request assigning said set of access control lines and corresponding data lines currently assigned to said first data access port to said second data access port and following completion of said data access request received at said first data access port subsequently assigning said first data access port to said set of access control lines and corresponding data lines previously assigned to said second access port.

A third aspect provides a multiport memory comprising:

an array of storage means for storing data, each storage means comprising data storage circuitry and a plurality of access control means for isolating said storage circuitry from or connecting said storage circuitry to a data line, said memory comprising a plurality of sets of access control lines and corresponding data lines, each set of access control lines controlling one of said plurality of access control devices for each of said storage cells, said data lines each being coupled to a column of said storage cells and said access control lines each being coupled to a row of said storage cells;

a plurality of data access ports;

access control means for assigning each data access port to one of said sets of access control lines and corresponding data lines;

said access control means comprising collision detection means for detecting a colliding data access request received at a second data access port that requests access to a row of storage means currently being accessed by a data access request received at a first data access port;

said access control means being responsive to said detected colliding data access request to assign said set of access control lines and corresponding data lines currently assigned to said first data access port to said second data access port and following completion of said data access request received at said first data access port to subsequently assign said first data access port to said set of access control lines and corresponding data lines previously assigned to said second access port.

The above, and other objects, features and advantages of this invention will be apparent from the following detailed description of illustrative embodiments which is to be read in connection with the accompanying drawings.

DESCRIPTION OF THE EXAMPLE NON-LIMITING EMBODIMENTS

Figure 1:
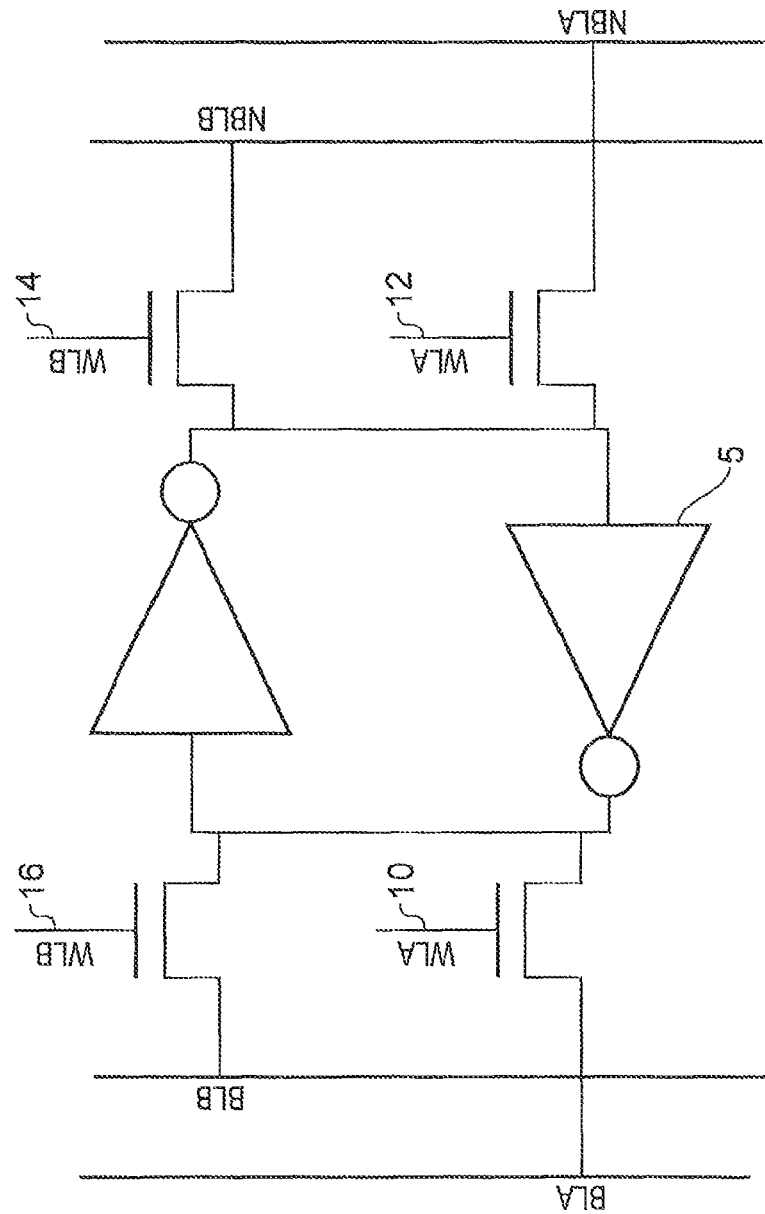
FIG. 1 shows an eight transistor bit cell with two word lines and two sets of bit lines.

FIG. 1 shows an 8 transistor bit cell 5 for a dual port memory. Bit cell 5 has two access control devices or pass gates 10, 12 controlled by a first word line WLA and two access control devices 14, 16 controlled by a second word line WLB. Access control devices 10, 12 connect the bit cell 5 to a first pair of bit lines BLA, NBLA and access control devices 14, 16 connect the bit cell 5 to a second pair of bit lines BLB, NBLB. A first port to the memory that requires access to bit cell 5 will transmit data to and from the cell via bit lines BLA, NBLA in response to a signal on word line WLA, while a second port will transmit data to and from the bit cell 5 via bit lines BLB, NBLB in response to a signal on word line WLB.

Figure 2:
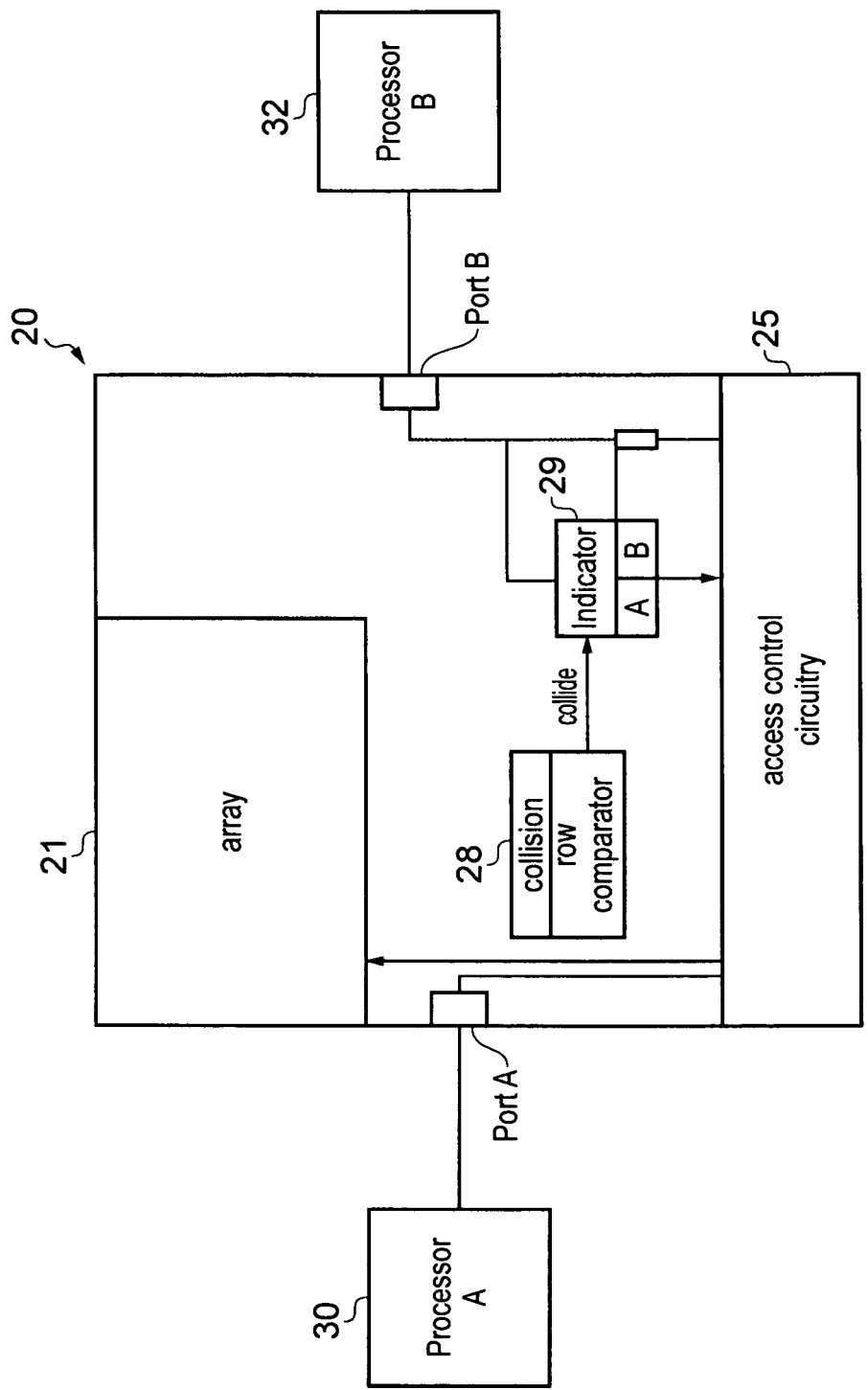
FIG. 2 shows a data processing apparatus having a dual port memory according to an embodiment of the present invention.

FIG. 2 schematically shows a memory 20 formed of an array 21 of bit cells such as those shown in FIG. 1. This memory has two ports shown as A and B via which two processors 30, 32 communicate with the memory. Access control circuitry 25 assigns access requests received at the two ports A and B to one of the two sets of word lines and bit lines that allow access to the bit cells within the array 21. This assignment is determined by a value stored in value A or value B of indicator store 29.

Collision detection circuitry 28 detects concurrent accesses to a same row in the array 21 and sets the indicator values within indicator store 29 for the ports such that they are assigned the appropriate set of word lines and bit lines. In this regard, where a request at port A collides with a request received at port B, the indicator value of port A is updated such that it is mapped to the same bit lines and word lines that port B is currently mapped to. In this way the same word lines and data lines are used to perform the two accesses. Once the data access received at port B has finished the indicator value for port B is updated to the value that port A previously had such that the next access can be performed and it does not have to wait for the access at port B to complete.

Thus, if initially port A is mapped to word line WLA and bit lines BLA, and port B is mapped to word line WLB and bit lines BLB, then if a colliding access is received at port A, port A is connected to word line WLB and bit lines BLB to service the colliding access and when the access with which it collided has completed and a subsequent access request is received at port B, port B is connected to WLA and BLA and the subsequent access request is serviced using these lines.

Figure 3:
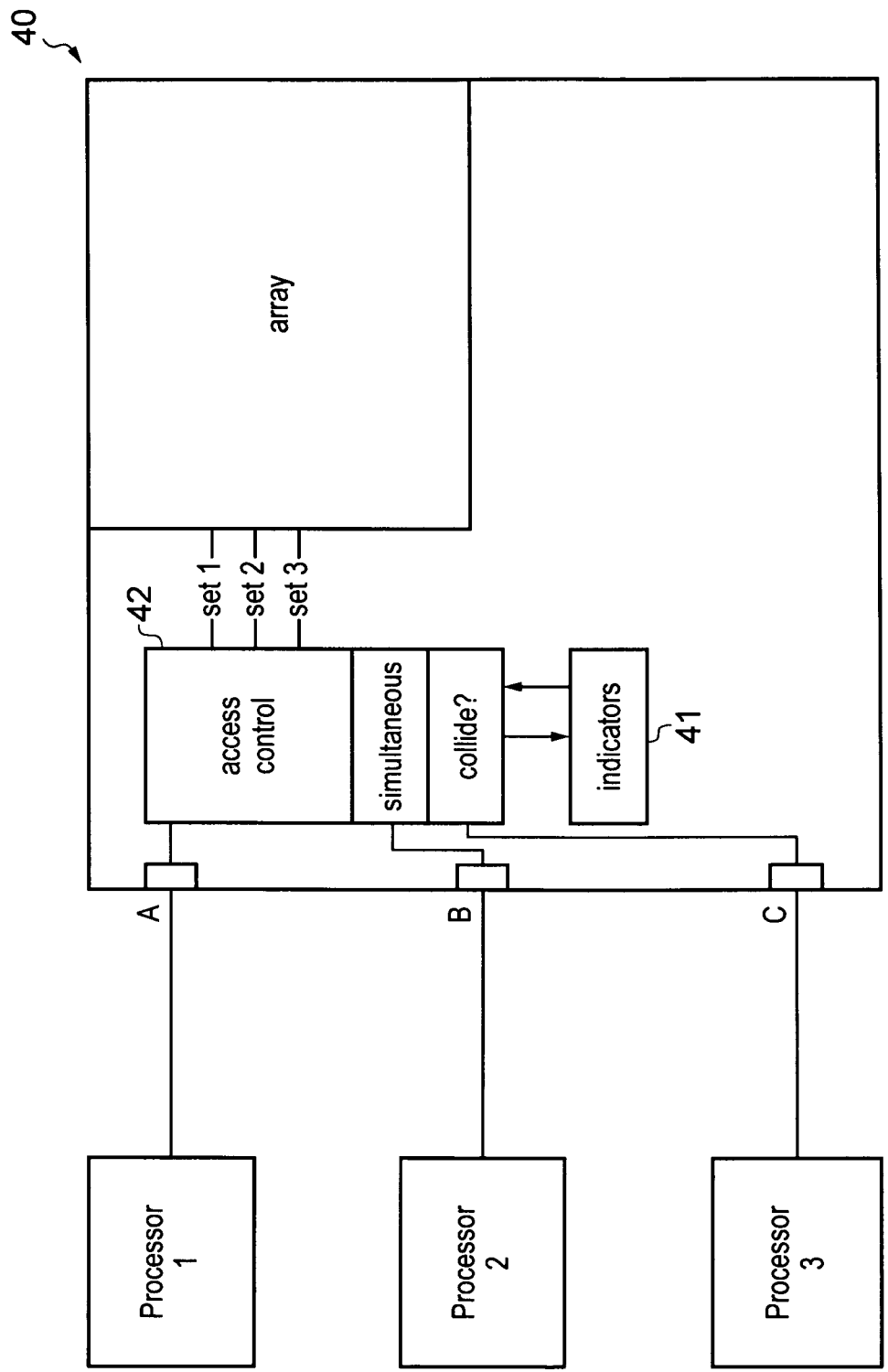
FIG. 3 shows a data processing apparatus having a multiple port memory according to an embodiment of the present invention.

FIG. 3 shows a further multiport memory 40 that has three ports A, B, C that communicate with three different processors. In this case access control circuitry 42 determines whether there is a collision between any two of the three ports A, B, C and in response to detecting a collision updates the indicators for the port stored in indicator store 41 that indicate which set of word lines and bit lines, set 1 WLA, BLA, set 2 WLB, BLB or set 3, WLC, BLC receiving the colliding data access such that it is routed to the same set of word lines and bit lines as the request with which it collides. The port that received the first request of the colliding requests is, on receipt of a new data access request, assigned to the set of word lines and bit lines that the port of the later colliding request was previously assigned to. Thus, some indication of this previous assignment will need to be stored within indicator store 41.

As can be appreciated although examples have been given of two and three port memories a memory with any number of ports could be configured according to embodiments of the present invention to handle data collisions using this system of dynamic memory port mapping to map ports receiving colliding data access requests to the same sets of data lines and access control lines and then to reassign a first received colliding data access request to a set of data lines and access control line that has become available due to the mapping of the ports of the colliding access requests to the same set of lines.

Figure 4:
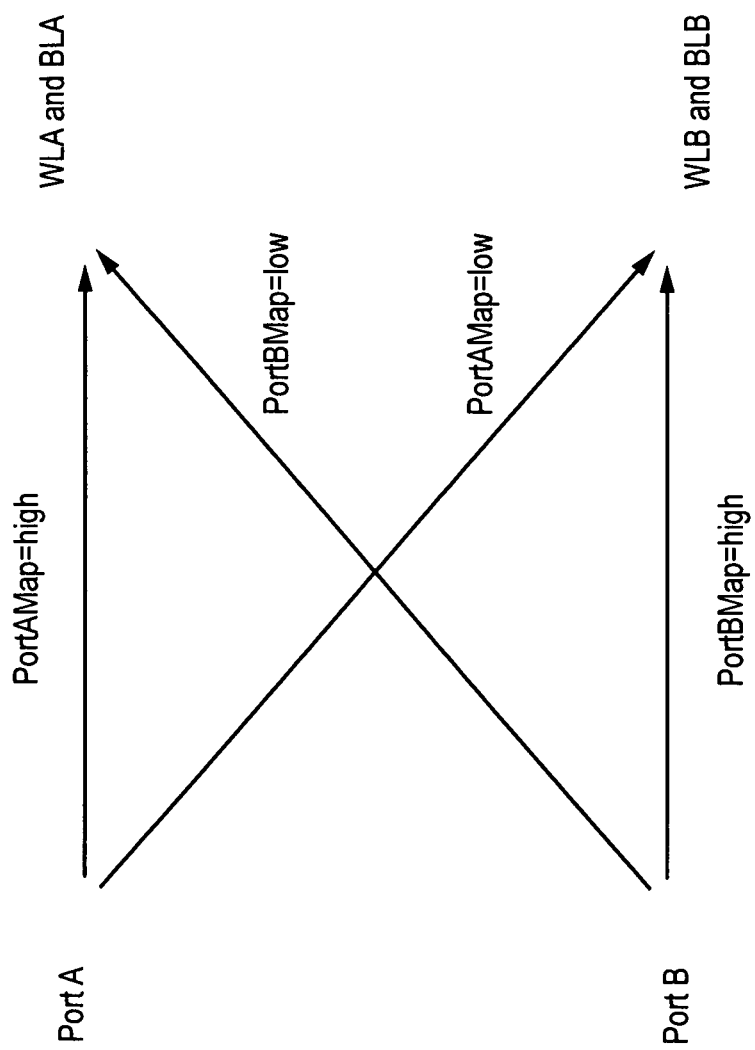
FIG. 4 shows schematically the dynamic dual port mapping.

FIG. 4 schematically shows the use of indicator values to map the access ports to sets of word and bit lines of a dual port memory. Thus, in this case there are two ports, port A and port B and two indicator values portAmap and portBmap. Where portAmap or portBmap is high then this port is mapped to what could be considered their own word lines and bit lines thus port A to WLA and BLA and port B to WLB and BLB. Where either of these indicators is low then the port is mapped to the word lines and bit lines of the other port. Thus, port A is mapped to WLB and BLB when portAmap is low and port B is mapped to WLB and BLB when portBmap is low.

These values of portAmap and portBmap are set at the start of a data access request cycle to a value held by a global indicator bit and they are then latched to this value for the data access cycle. The global indicator bit toggles value in response to a collision detector detecting a colliding data access request. Thus, initially the global indicator bit is set high and at the start of an access cycle portAmap and portBmap are assigned the value of the global indicator bit and thus, they are both set high and they are therefore both assigned their own word lines and bit lines. In response to detecting a colliding data access then the global indicator bit will toggle to a low value and at the start of the next data access cycle which will be the second access request of the colliding access requests the port map value for that port will be updated with the global indicator value and will therefore be set low and this will indicate that that it should be assigned the word line and bit line of the other port. Thus, if port B receives an access request that accesses the same line as port A is already accessing the collision detector will toggle the global indicator bit which will set portBmap low and this will cause port B to use WLA and BLA for this request. Once port A has finished its data access request and starts the next one, its indicator value portAmap will be updated with the value of the global indicator bit which will be low and thus, it will be mapped to the WLB and BLB for the next access request.

At each access request the portmap indicator values will be updated with the global indicator bit and thus, will continue to map to each other's word lines and bit lines until the global indicator bit toggles again in response to another colliding data access. This toggle will cause the second colliding access request to have its indicator value updated with the high global indicator bit and thus, it will map its port to its own word line and bit lines which are currently being used by the other port servicing the data access request with which it collided. When this access request has completed and a subsequent request is received the portmap value for this port will also be updated with the toggled global indicator value and both ports will again use their own bit lines and word lines. In this way the mapping of the word lines and bit lines to account for colliding data accesses can be controlled by the use of a bit that toggles and an indicator value for each port. No history of previous mappings for a port need to be stored as the toggling bit will automatically route requests to suitable ports.

Figure 5:
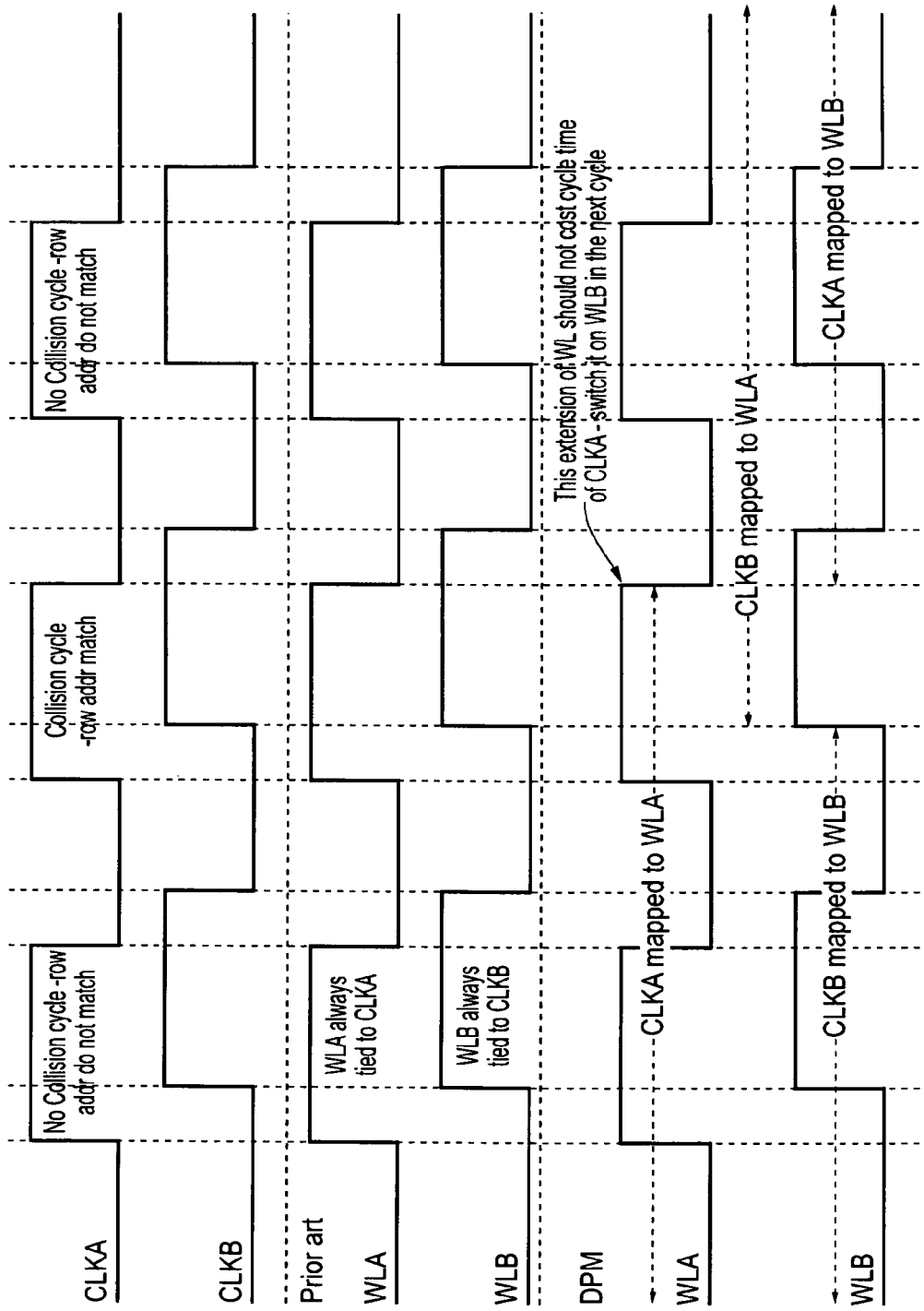
FIG. 5 shows a timing diagram illustrating the timing of access requests in a dual port memory.

FIG. 5 shows the timing diagram indicating how the timing of such accesses work. In this embodiment an access cycle at a port is clocked by a clock to that port and the word line for the required row is tied to the clock by address decoding circuitry for the row.

Where there is no collision the accesses occur independently of each other using their own bit lines and word lines. However, where there is a collision then the two accesses are routed to the same word line, word line WLA in this example and this word line is therefore turned on for an extended period as it receives CLKA and then CLKB as it is controlling the accesses from both port A and port B.

When the next access at port A is received, port A is mapped to WLB and BLB and thus, its access can be performed with standard timing as it does not need to wait for the access request at port B to complete as it will be using different word lines and bit lines for the data access.

Figure 6:
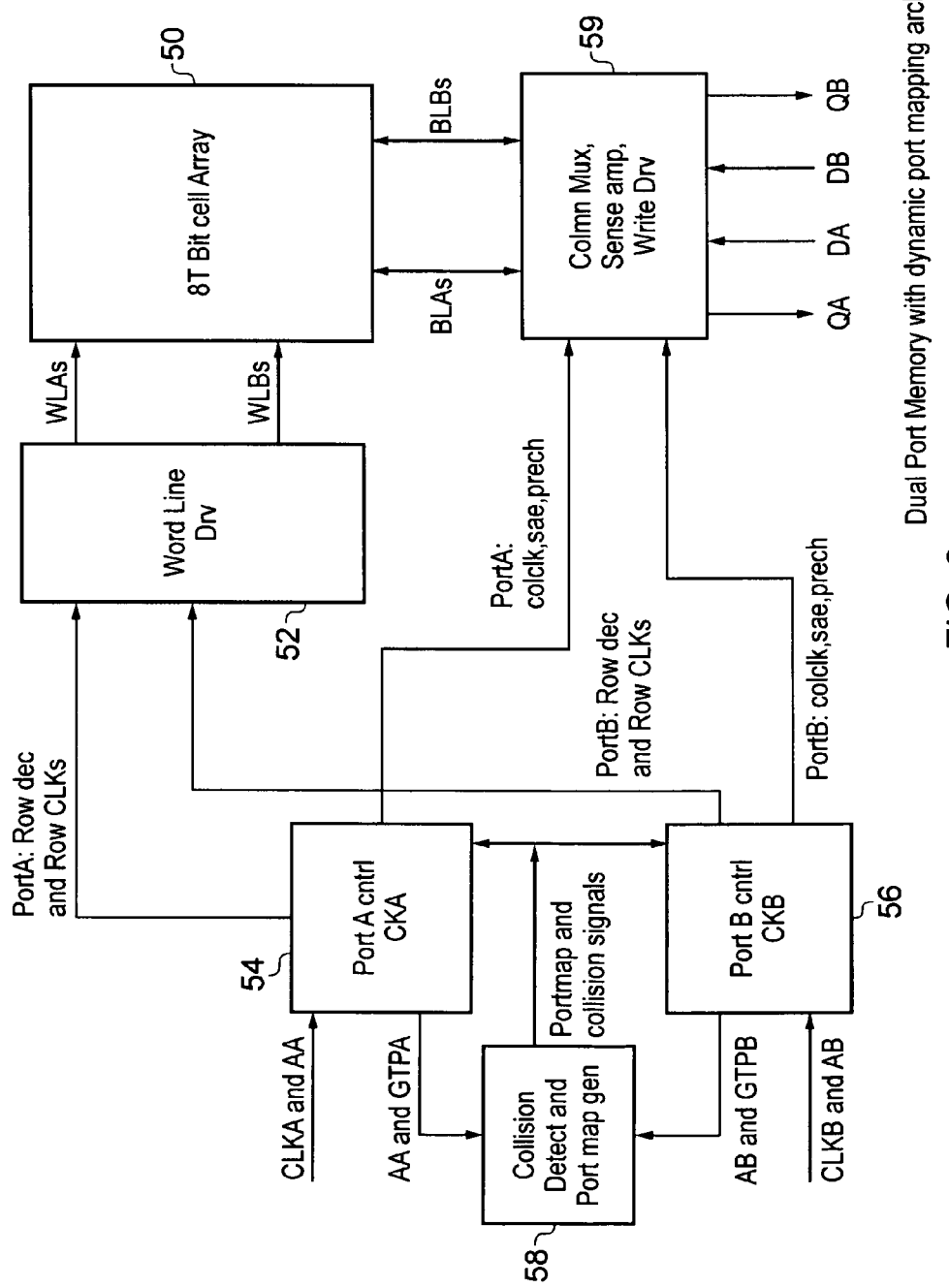
FIG. 6 schematically shows a dual port memory according to an embodiment of the present invention.

FIG. 6 shows schematically a dual port memory with dynamic port mapping according to an embodiment of the present invention. There is a bit cell array 50 comprising an array of 8 T bit cells such as is shown in FIG. 1. There is a word line driver 52 that drives both WLA and WLB and there are two data ports, port A and port B which are controlled by respective control circuitry portA cntrl 54 and portB cntrl 56. There are also two sets of bit lines, BLA and BLB and there is input/output circuitry 59 in the form of sense amplifiers for reading the values on the bit lines and write drivers for driving a value onto the bit lines in response to a write request, outputting the data from these bit lines.

There is also a collision detector and indicator value generator 58, that detects colliding data accesses to a same row and assigns word lines and bit lines from the two sets WLA, BLA and WLB, BLB to the ports.

In operation an access request will be received at port A and one will be received at port B, perhaps at a different time. The access cycle for each access request will be activated by clocking signals, CLKA and CLKB respectively. Row decode will then determine which row is being accessed by the different ports and where they are concurrently accessing the same row collision detector 56 will detect this and will generate a collision indication which will be received by the port control circuitry 54 and 56 and the indicator values for these ports will be updated accordingly. In this example, the memory is a dual port memory that operates in the way shown with respect to FIG. 4. Thus, there is a global indicator bit globalportMap that toggles in response to the collision detection. The indicator values for each port within the port control circuitry 54 and 56 are updated with the global indicator value globalportMap at the start of each cycle and are then latched to this value for the access cycle.

Figure 7:
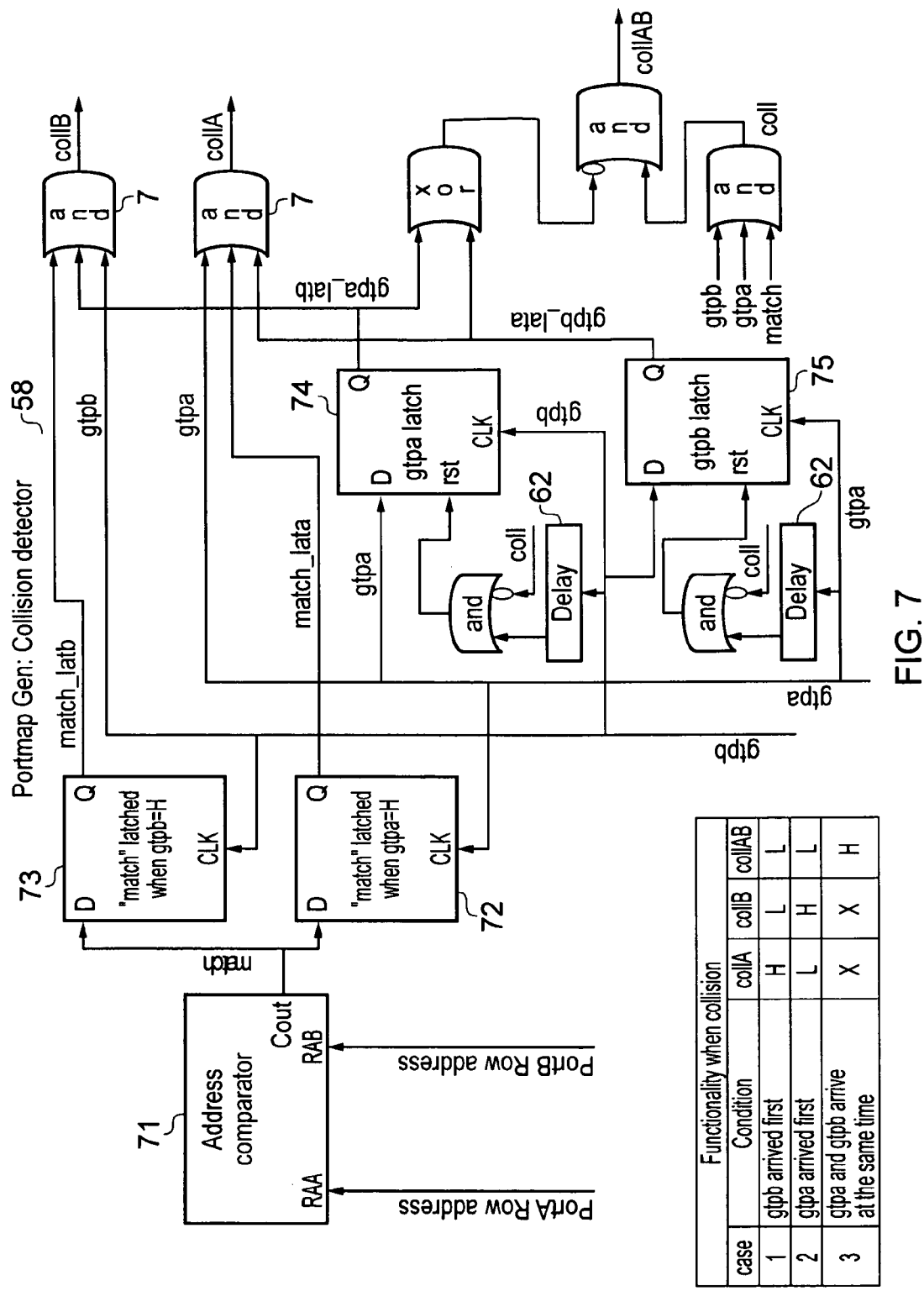
FIG. 7 shows the collision detector of FIG. 6.

FIG. 7 shows the collision detector and portmap generator 58 of FIG. 6. An address comparator 71 determines when the same row address is being accessed and there is therefore a collision. This signal is sent to the latches 72 and 73 which output a latched match signal.

A further latch 74 receives a gtpa signal indicating the start of a data access at port A, while further latch 75 receives a gtpb signal indicating the start of a data access signal at port B. These two latches are clocked by the other one of the start indicator signal gtpb or gtpa respectively. Thus, gtpb is latched as gtpb_lata on the rising edge of gtpa while gtpa is latched as gtpa_latb on the rising edge of gtpb.

The start indicator signal gtpa or gtpb clocking the further latches 74 and 75 is also used following a delay determined by delay circuitry 62 to reset these latches. This delay should be such that delayed gtpb or gtpa will reset the latches only when the collision cycle ends i.e. when the coll signal gets deactivated.

An override signal collAB is generated if the two signals indicating a start of the data access cycle gtpa and gtpb are received simultaneously. This override signal is used to set both the ports to use a predetermined one of the word lines and bit lines, in this case WLA and BLA, NBLA (see FIG. 9). It is also used to inhibit the globalportMap value from toggling (see FIG. 8).

The delay of delay circuitry 62 also allows globalportMap to flip and propagate to port A and port B cntrl 54, 56 before the latches 74, 75 are cleared. Clearing the latches 74, 75 will in turn deactivate collA or collB if they were active. If these latches were not cleared then if there were two consecutive non-simultaneous collision cycles the circuit might trigger collAB which would override the portMap signals and might lead to an access failure.

Figure 8:
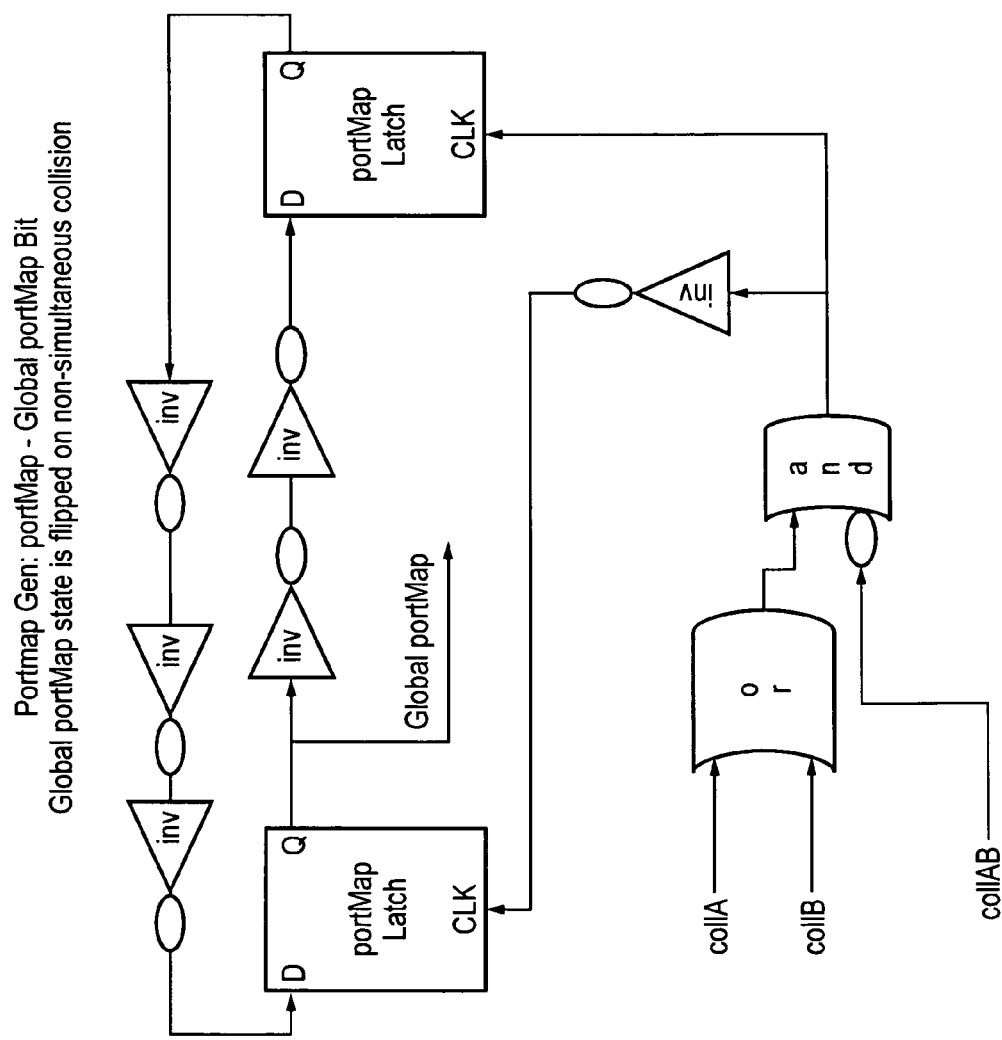
FIG. 8 shows the port map generator of the dual port memory of FIG. 6.

FIG. 8 shows circuitry where collA and collB are used to flip the globalportMap value, while collAB inhibits it from flipping. The circuitry is designed so that globalportMap flips its state on non-simultaneous arrival of the clocks, but does not do so on simultaneous arrival where collAB is high. On simultaneous arrival of the clocks both portA and portB use WLA and BLA for the bit cell access. On power up globalportMap can be either high or low.

Figure 9:
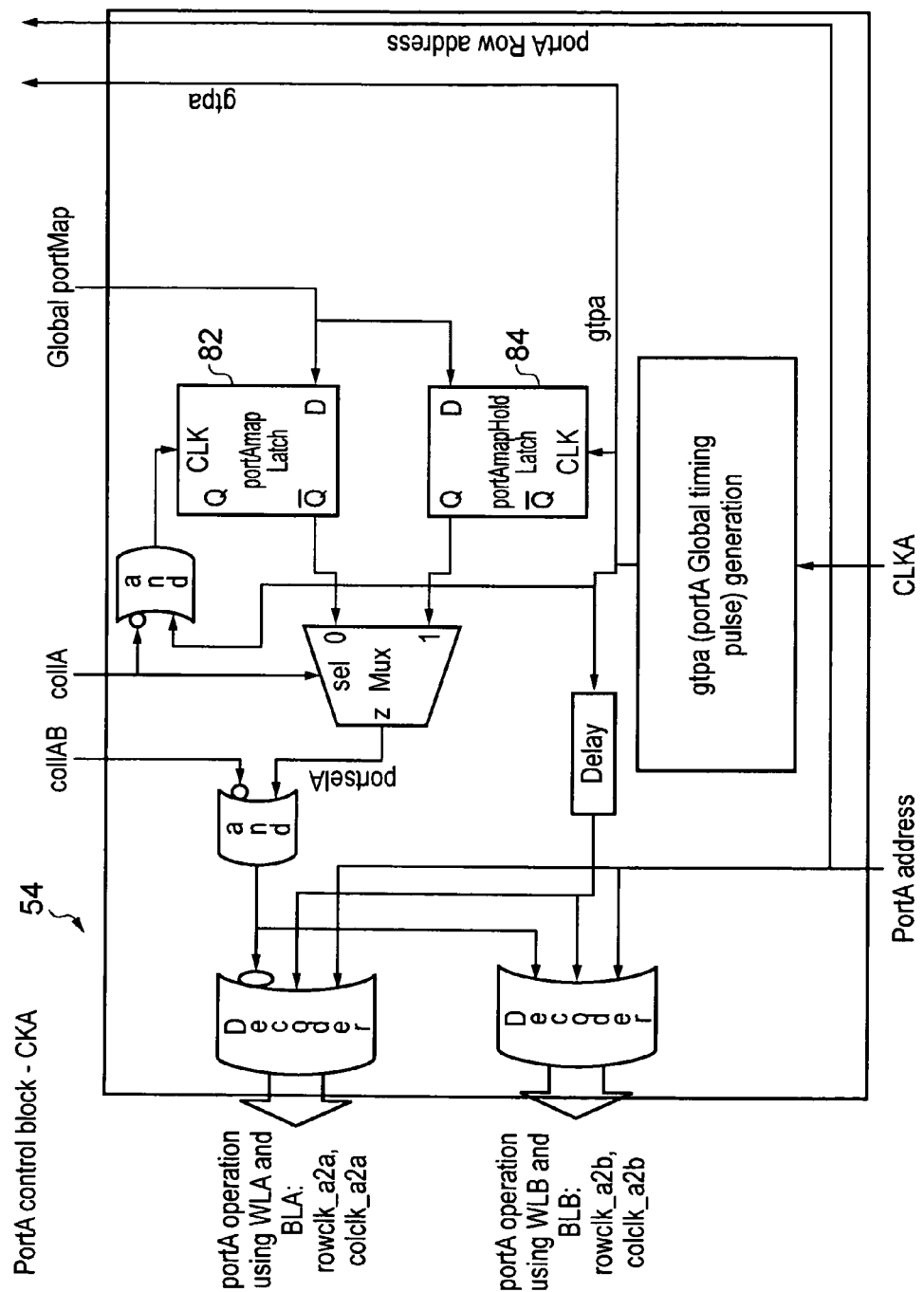
FIG. 9 shows a control block for memory port A of FIG. 6.

FIG. 9 shows port A control block 54 of FIG. 6 in more detail. In this control block there are two latches portAmap 82 and portAmapHold 84, that both store latched indicator values indicating a set of word lines and bit lines to use for a data access. Latch portAmap is clocked by a signal indicating a start of the data access gtpa where there is no collision and collA is not active and thus, holds a value of the global indicator bit globalportMap at the start of the data access cycle, where there is no collision both collA and collAB are low and either WLA, BLA or WLB, BLB are used to access the bitcell
depending on the latched portmap state in the portAmap latch.

Where there is a collision and CLKA arrives first, then both collA and collAB are low and either WLA, BLA or WLB, BLB are used to access the bitcell depending on the latched portmap state in the portAmap latch.

Where CLKA and CLKB arrive at the same time collAB is activated by the collision detector and when collAB is active irrespective of the portmap status, rowclk_a2a and colclk_a2a are activated and they in turn use WLA and BLA for the bit cell access.

Where there is a collision and CLKB arrives first, when CLKA then arrives, the collision detector activates collA and the memory access starts using inverted portMap available in the portAmapHold latch. Using the portAmapHold latch which outputs the inverted value makes it possible to start the access without having to wait to receive the toggled global portMap bit from the port map generator of FIG. 8. The global port map is used to synchronise port A and port B at the start of any access cycle. Where port A starts its operation in a collision cycle after port B, then the port B access may finish and deactivate its clock and therefore collA before the port A access has finished. The port A operation can continue without being affected by latching the flipped global portMap value in the portAmap latch.

Figure 10:
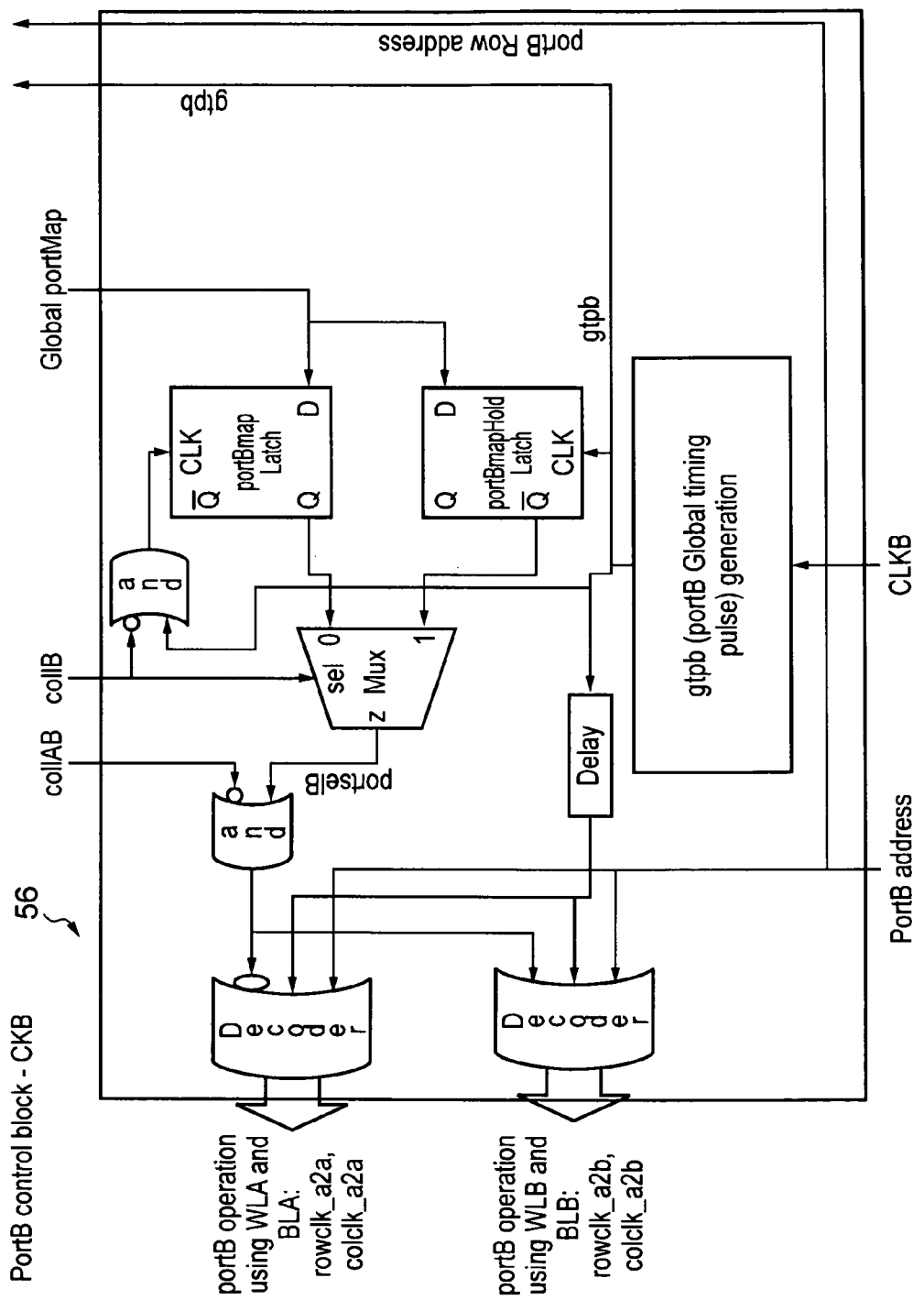
FIG. 10 shows a control block for memory port B of FIG. 6.

FIG. 10 shows the corresponding port B control block 56 of FIG. 6. This functions in the same way as block 54 of FIG. 9 except for the polarity of the latched portmap and portmaphold that it uses at the multiplexer input. That is the inverted value of globalportMap is output at portAmaplatch where the actual value of it is output at portBmaplatch, while the hold latches output the value of portmap at port A and the inverse value at port B.

Figure 11A:
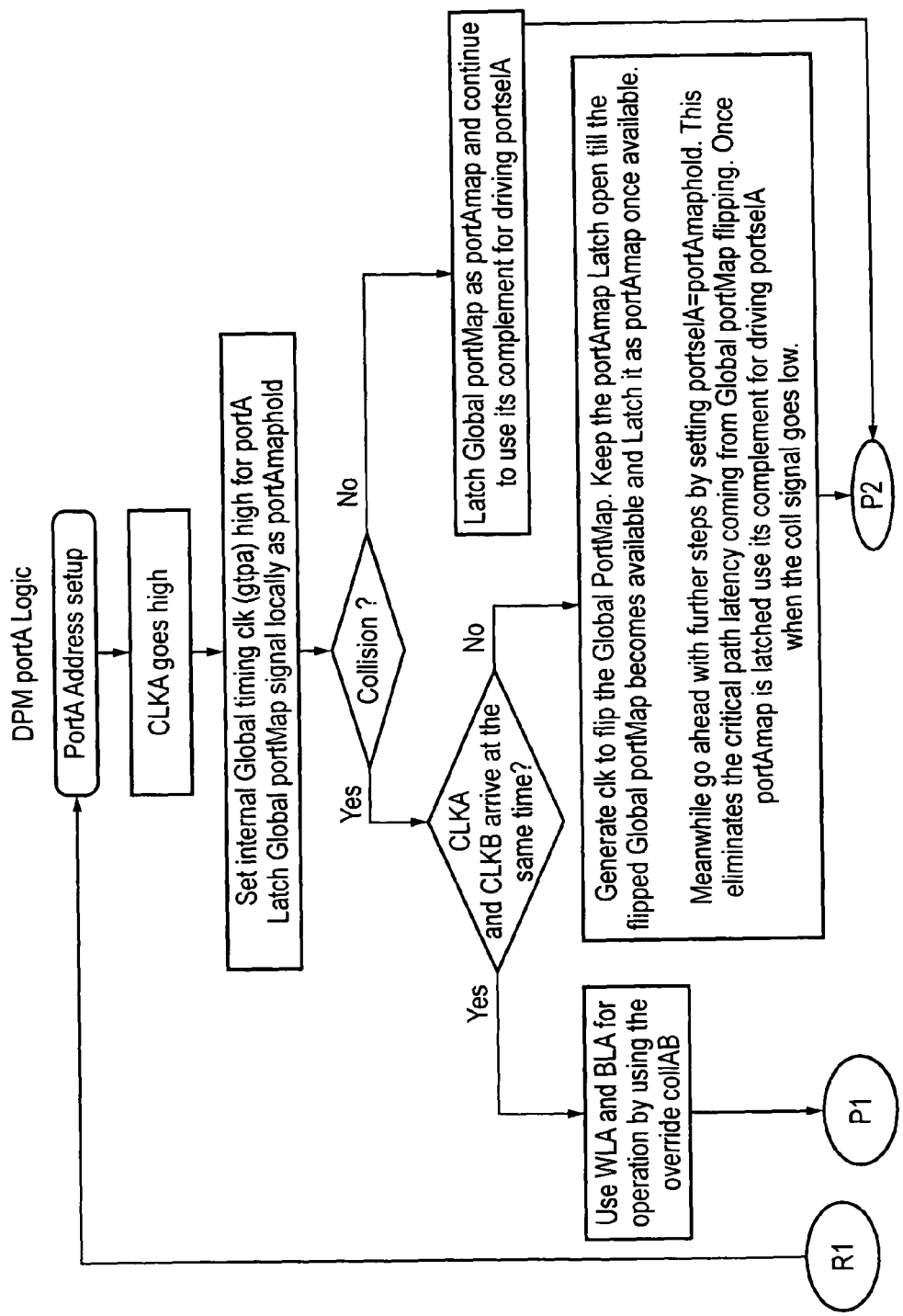
FIGS. 11a and 11b shows a flow diagram illustrating steps in a method for assigning access control lines and data lines to port A of FIG. 6.
Figure 11B:
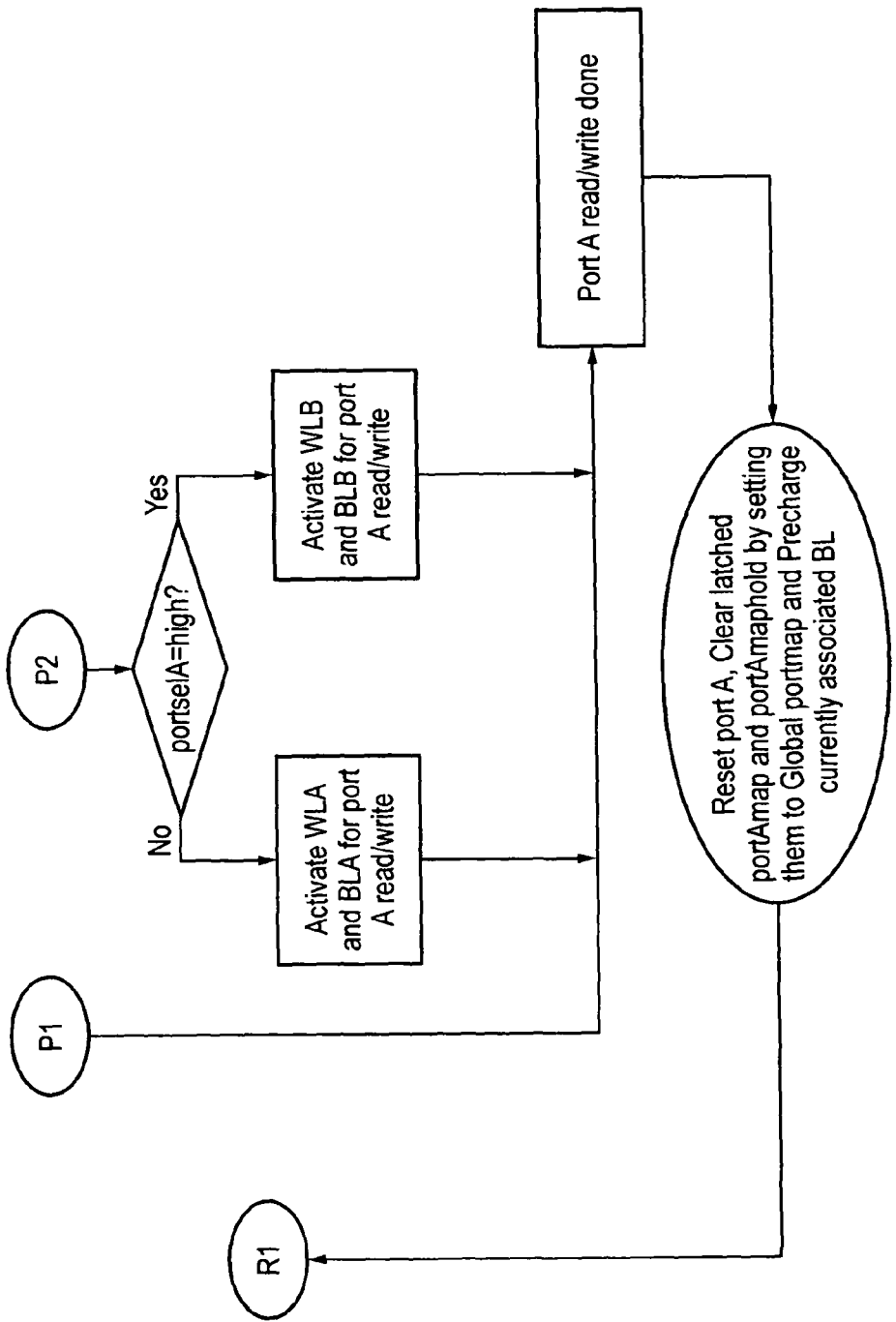

FIGS. 11a and 11b show flow diagrams illustrating steps performed for a data access request received at port A. Thus, initially an access request specifying an address is received at port A. The clock CLKA clocking the port then goes high and the internal global timing clock gtpa is then set high for the port and the globalportMap signal is latched locally at portAmaphold.

It is then determined whether there is a collision. If there isn't a collision then the value in globalportMap is latched into portAmap and the complement of this value is used to drive the portselA signal. If this is high (see FIG. 11b) then WLB and BLB are activated for port A while it is low WLA and BLA are activated. The access is then performed and the port is reset with the latches portAmap and portAmaphold being cleared by setting them to the globalportMap value and the currently associate bit lines are precharged.

If there is a collision, then it is determined whether CLKA and CLKB arrive at the same time.

If they do not arrive at the same time then a clock signal is generated to flip the global port map. PortAmap latch is kept open till the flipped global port map becomes available and this is then latched into the portAmap latch once it is available. At the same time the further steps of accessing the bit cell are performed by setting portselA equal to the value in port Amaphold latch. This prevents undue latency due to waiting for the global port map to flip.

If the CLKA and CLKB arrive at the same time then WLA and BLA are used for the operation. This is controlled by the override signal collAB.

Figure 12A:
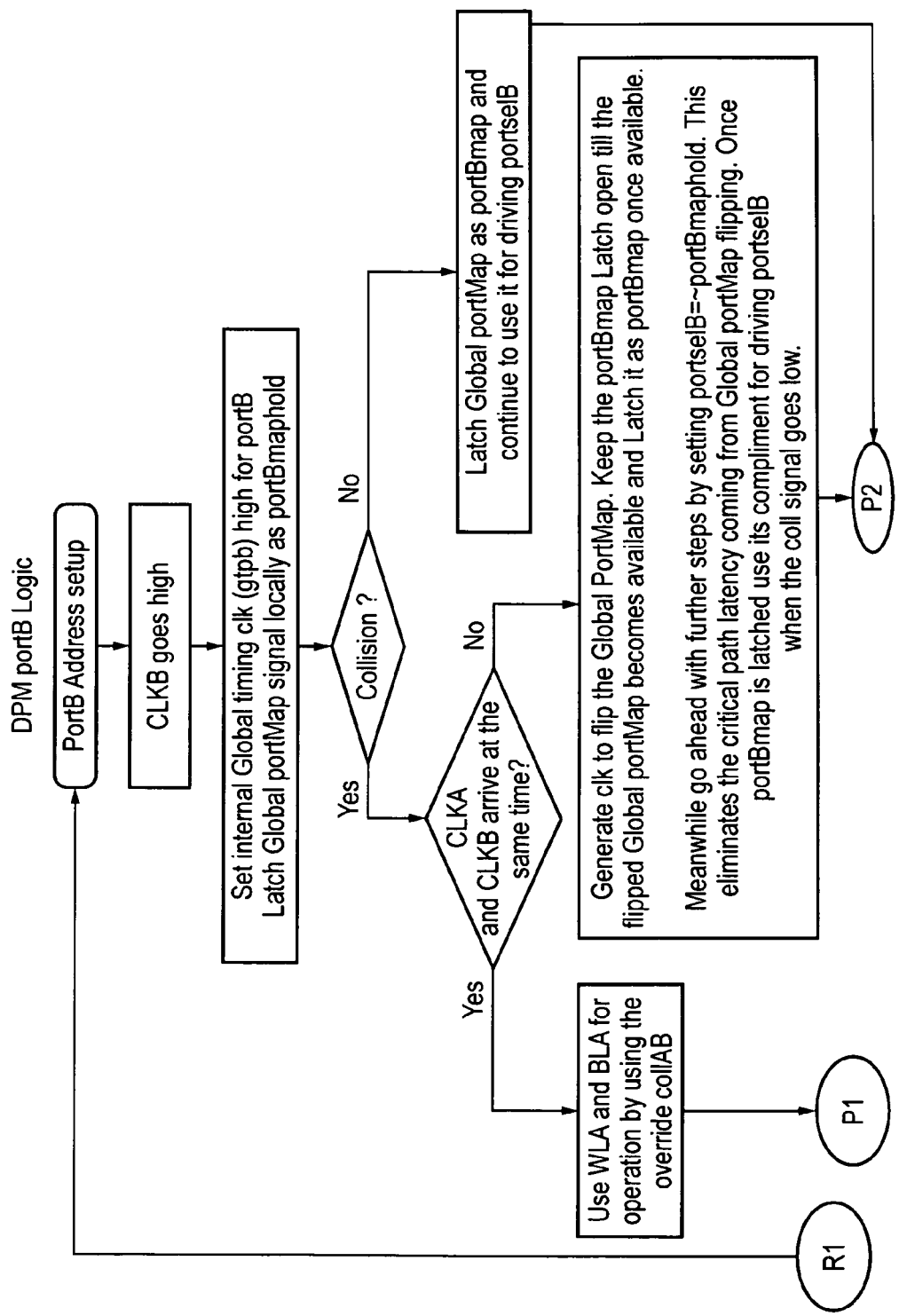
FIGS. 12a and 12b shows a flow diagram illustrating steps in a method for assigning access control lines and data lines to port B of FIG. 6.

FIG. 12 shows a corresponding flow diagram for port B. Initially an access request specifying an address is received at port B and the clock CLKB goes high. This sets the internal global timing clock gtpb high for port B and the portMap signal is latched locally at port Bmap hold latch.

Figure 12B:
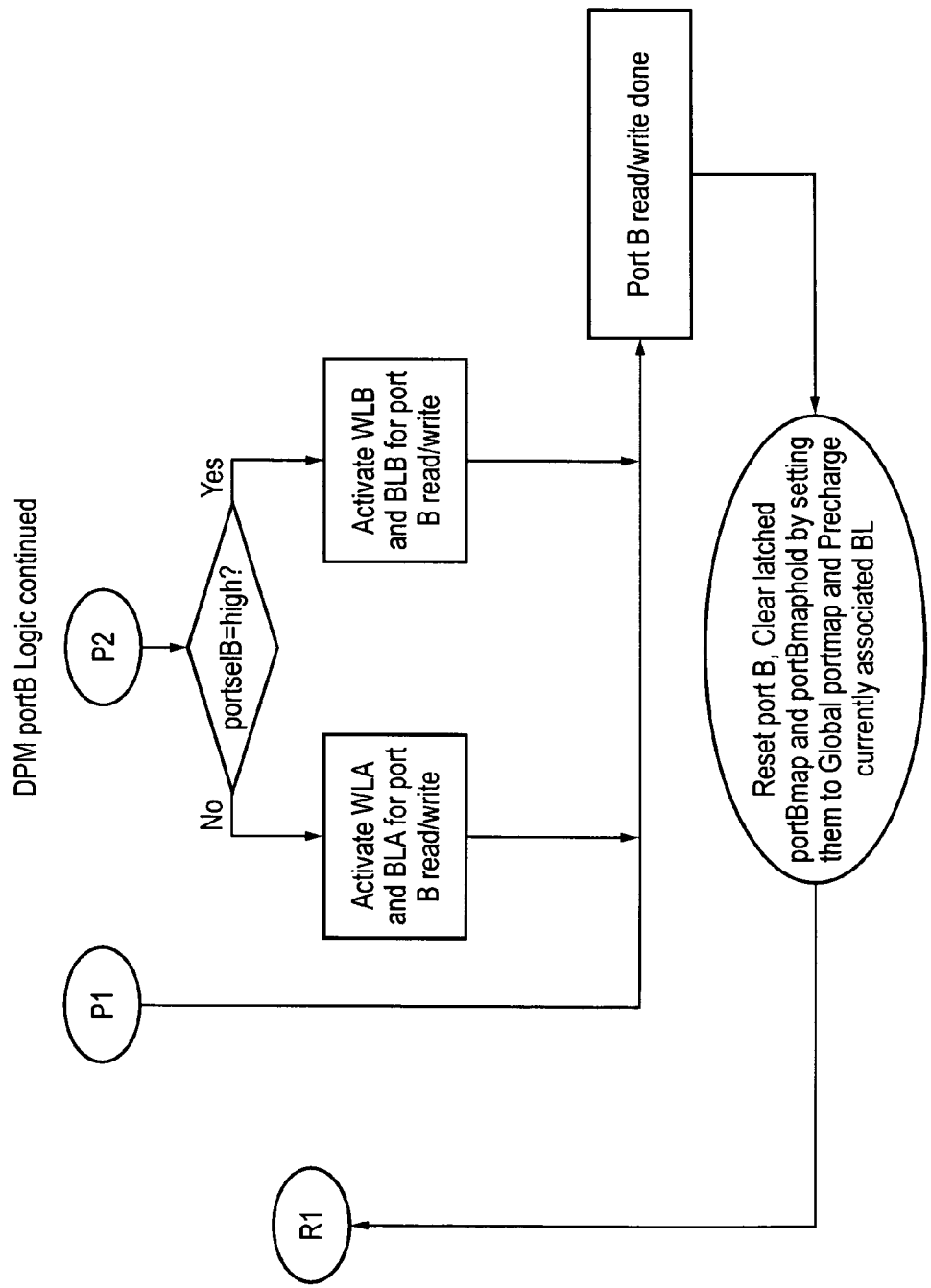

It is then determined if there is a collision. If there is no collision then the global port map is latched at port B map and it is used for driving the portselB signal which selects the port. In this regard if it is high then WLB and BLB are used for port B while if it is low WLA and BLA are used for port B as is shown in FIG. 12b. Once the access has completed then the port is reset by clearing the latches port B map and port B map hold and setting them to the value of the global port map. Furthermore, currently associated bit lines are pre-charged. If there is a collision then it is determined whether CLKA and CLKB arrive at the same time. If they don't then a clock to flip the global port map is generated and the port B map latch is kept open until the flipped global port map becomes available and this is then latched into the port B map latch. At the same time the further steps of accessing the bit cell are performed by setting portselB equal to the inverted value in port A map hold latch. This prevents undue latency due to waiting for the global port map to flip.

If the CLKA and CLKB arrive at the same time then WLA and BLA are used for the operation. This is controlled by the override signal collAB.

FIG. 13 shows some timing diagrams during different accesses to the dual port memory of FIG. 6.

Figure 13A:
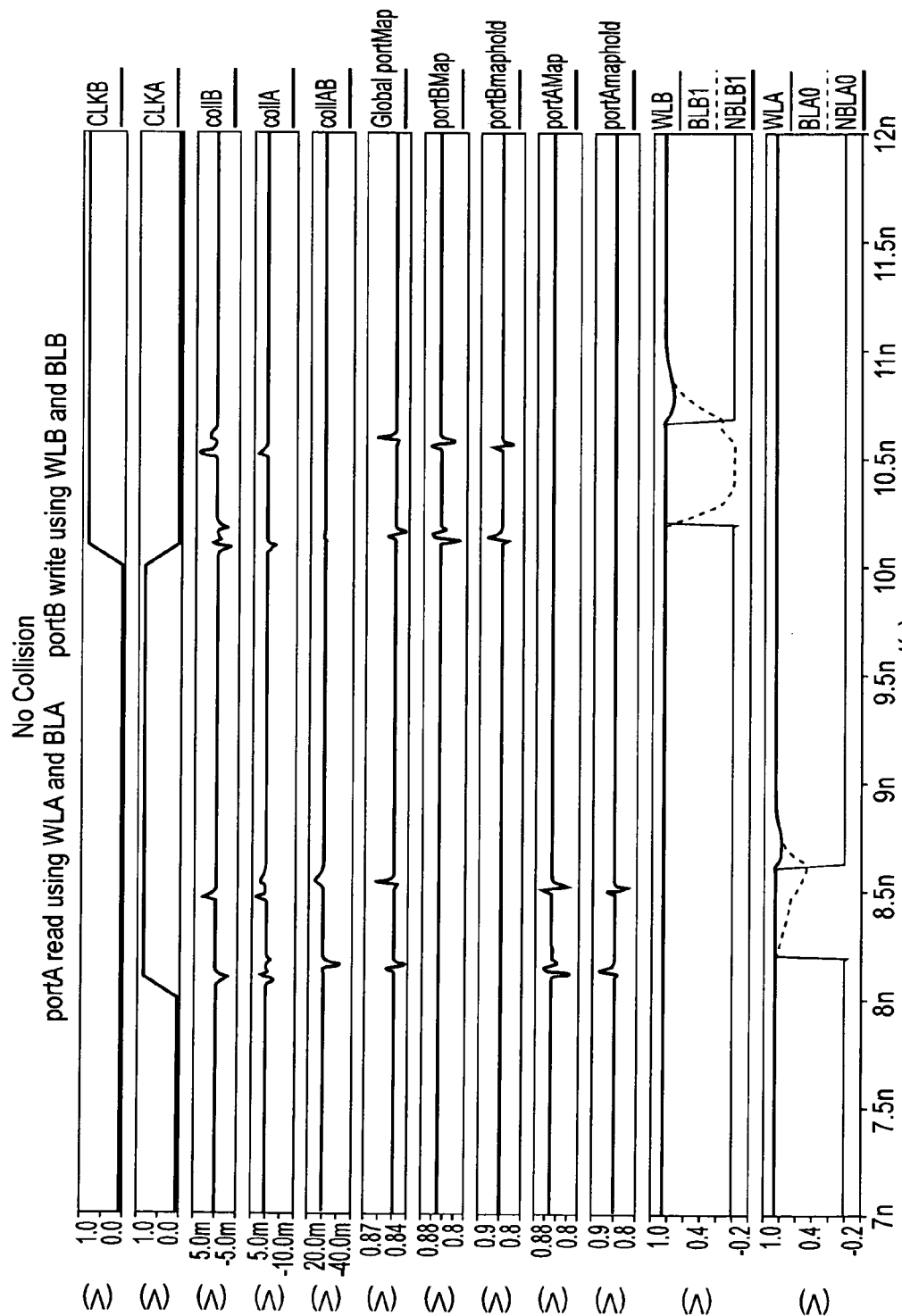
FIGS. 13a to 13c shows timing diagrams of access requests performed by the dual port memory of FIG. 6.

FIG. 13a shows the timings of two accesses occurring at the two ports to addresses on different word lines, where the two accesses occur one after the other. In this case there is a write at port B and a read at port A to different rows and thus, there is no collision and the value of global portmap does not toggle and thus, portAmap, and portBmap also do not change. The respective word lines are therefore activated and the values read and written within the normal timing cycles as is shown.

Figure 13B:
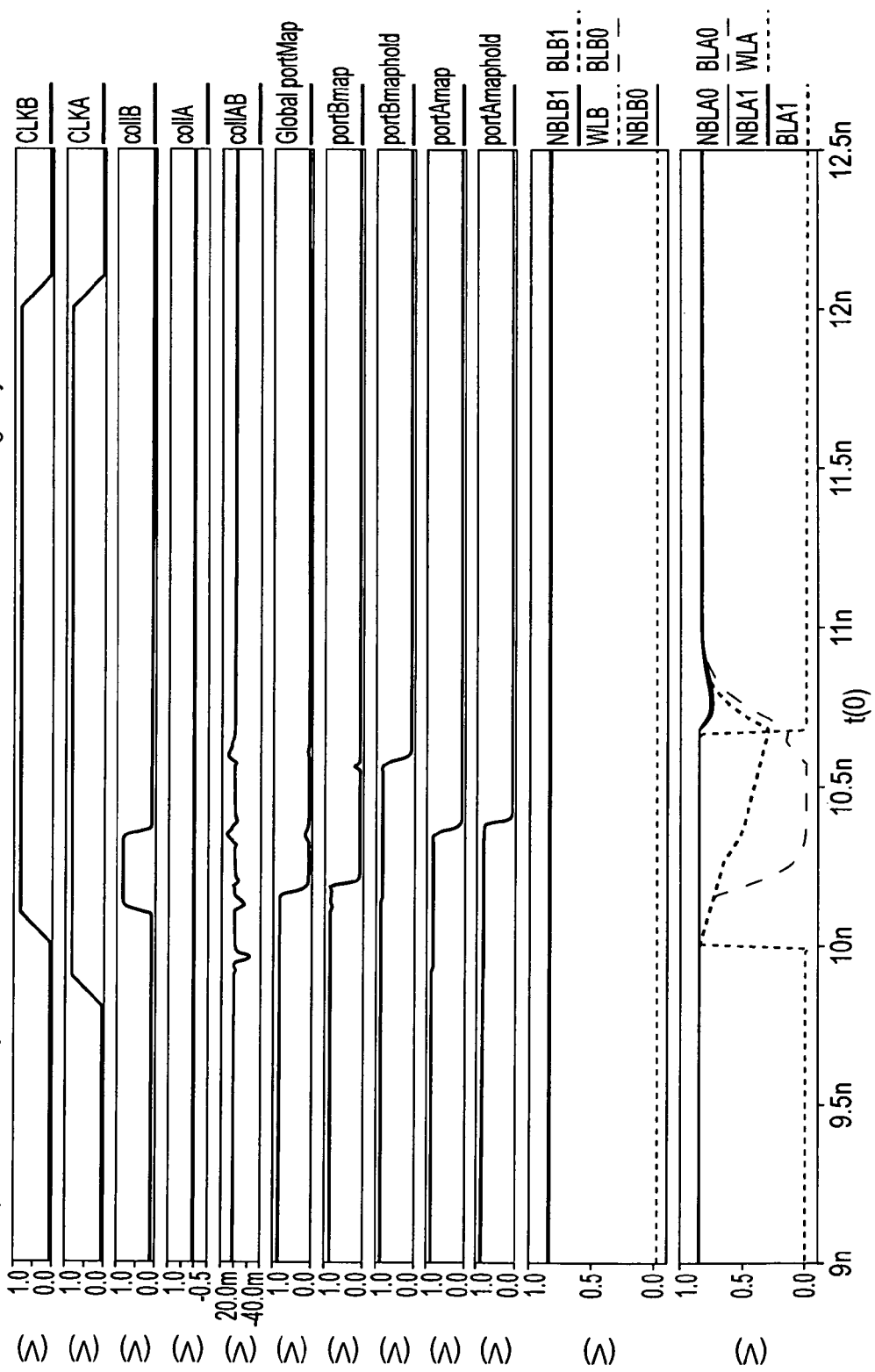

In FIG. 13b there is a data access collision and thus, the value of global portmap changes its state on the latest arriving clock, in this case CLKB and thus, the access at port B is routed to the same word line as that used for port A. Thus, in this case only one word line WLA is used for both data accesses.

Figure 13C:
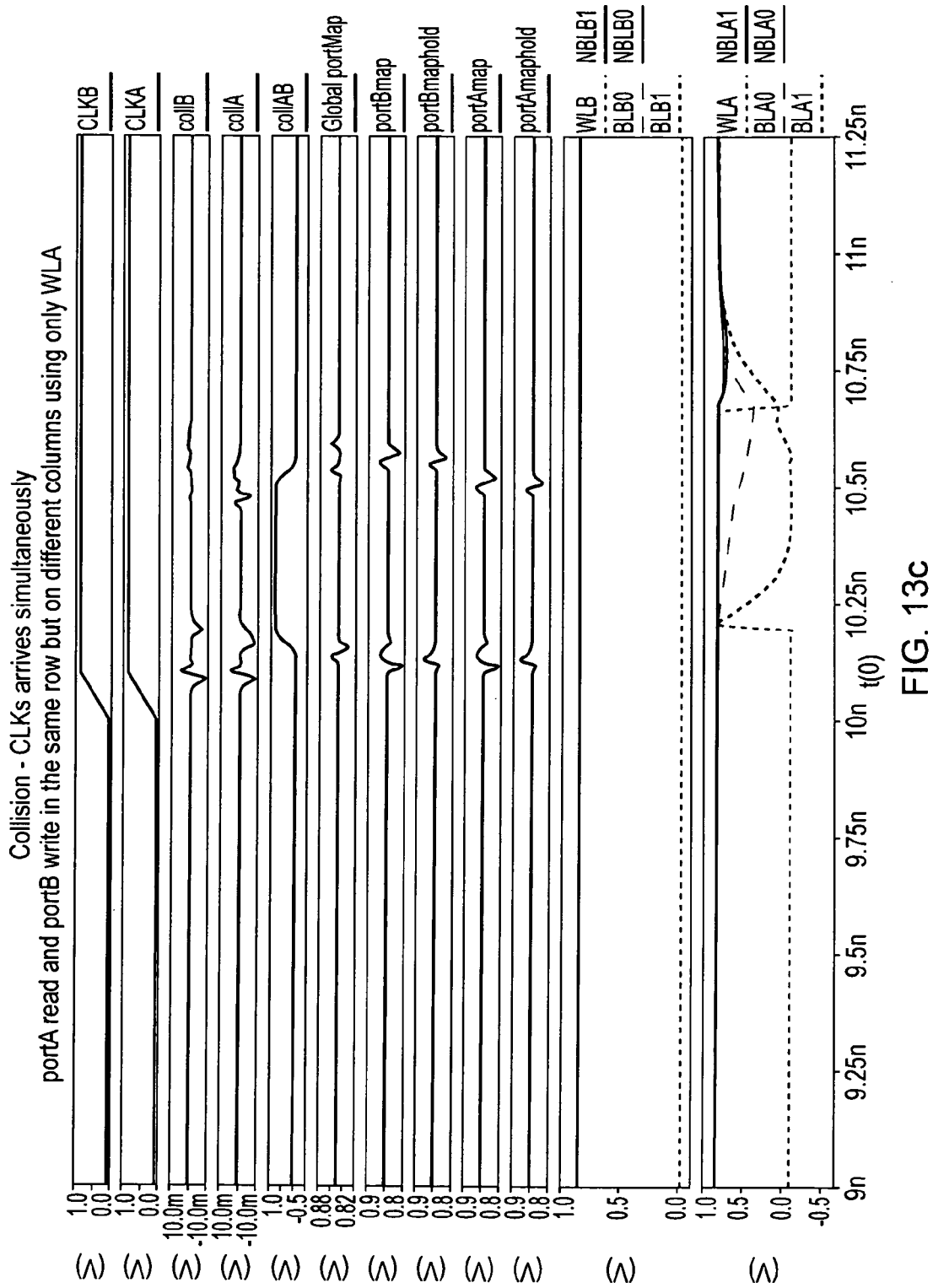

FIG. 13c shows two colliding access cycles with the two clocks arriving simultaneously. In this case collAB is activated and overrides the port selection such that WLA and BLA are selected for both accesses.

Although illustrative embodiments have been described in detail herein with reference to the accompanying drawings, it is to be understood that the claims are not limited to those precise embodiments, and that various changes and modifications can be effected therein by one skilled in the art without departing from the scope and spirit of the appended claims. For example, various combinations of the features of the following dependent claims could be made with the features of the independent claims.

I claim:

1. A multiport memory comprising:
an array of storage cells for storing data, each storage cell comprising storage circuitry and a plurality of access control devices for isolating said storage circuitry from or connecting said storage circuitry to a data line, said memory comprising a plurality of sets of access control lines and corresponding data lines, each set of access control lines controlling one of said plurality of access control devices for each of said storage cells, said data lines each being coupled to a column of said storage cells and said access control lines each being coupled to a row of said storage cells;
a plurality of data access ports;
access control circuitry configured to assign each data access port to one of said sets of access control lines and corresponding data lines;
said access control circuitry comprising collision detection circuitry configured to detect a colliding data access request received at a second data access port that requests access to a row of storage cells currently being accessed by a data access request received at a first data access port;
said access control circuitry being configured to respond to said detected collision to assign said set of access control lines and corresponding data lines currently assigned to said first data access port to said second data access port and following completion of said data access request received at said first data access port to subsequently assign said first data access port to said set of access control lines and corresponding data lines previously assigned to said second data access port.

2. The multiport memory according to claim 1, wherein said access control circuitry is configured to assign said data access ports to one of said sets of access control lines and corresponding data lines at a start of a data access cycle.

3. The multiport memory according to claim 1, wherein said access control circuitry further comprises indicator storage circuitry for storing an indicator value for each data access port indicating which of said sets of data lines and corresponding access control lines is currently assigned to said data access port.

4. The multiport memory according to claim 3, wherein said access control circuitry is configured in response to a data access request received at one of said data access ports to update said indicator value for said data access port in response to said collision detection circuitry indicating said data access request is a colliding data access request.

5. The multiport memory according to claim 3, wherein said memory is a dual port memory and comprises:
first and second data access ports and first and second sets of access control lines and data lines;
wherein said indicator storage circuitry further comprises a global indicator bit configured to toggle in response to said collision detection circuitry detecting a colliding data access request, a first value of said global indicator bit indicating said first and second data access ports are to be assigned to said first and second sets of access control lines and corresponding data lines and a second value of said global indicator bit indicating said first and second data access ports are to be assigned to said second and first sets of access control lines and corresponding data lines respectively;
wherein said access control circuitry is configured in response to a data access request received at one of said data access ports to set said indicator value for said data access port with a current value of said global indicator bit and to latch said value such that it is not updated again until completion of said data access request.

6. The multiport memory according to claim 5, further comprising first and second latching circuitry associated with each port, said first and second latching circuitry being configured to latch an indicator value indicating which of said access control lines and corresponding bit lines are to be assigned to said port in response to a signal indicating a start of a data access at said port, said first and second latching circuitry being configured to output a stored latch value from different output ports, such that one of said first and second latching circuitry outputs a stored value and an other of said first and second latching circuitry outputs an inverted stored value.

7. The multiport memory according to claim 6, further comprising override circuitry configured to detect colliding data access requests received at two of said data access ports and whose data access cycles start within a predetermined time of each other, said access control circuitry being responsive to said collision detection circuitry detecting a colliding access and said override circuitry not detecting simultaneous data accesses to select said access control lines in response to said indicator value stored in said first latching circuitry and in response to said collision detection circuitry not detecting a colliding access to select said access control lines in response to said indicator value stored in said second latching circuitry.

8. The multiport memory according to claim 1, said multiport memory further comprising override circuitry configured to detect colliding data access requests received at two data access ports and whose data access cycles start within a predetermined time of each other, said override circuitry being configured to assign both of said two data access ports to a predetermined access control line and corresponding data lines.

9. The multiport memory according to claim 5, said multiport memory further comprising override circuitry configured to detect colliding data access requests received at two data access ports and whose data access cycles start within a predetermined time of each other, said override circuitry being configured in response to detecting said simultaneous colliding data access requests to inhibit said global indicator bit from toggling.

10. The method of accessing data within a multiport memory having:
an array of storage cells for storing data, each storage cell comprising storage circuitry and a plurality of access control devices for isolating said storage circuitry from or connecting said storage circuitry to a data line, said memory comprising a plurality of sets of access control lines and corresponding data lines, each set of access control lines controlling one of said plurality of access control devices for each of said storage cells, said data lines each being coupled to a column of said storage cells and said access control lines each being coupled to a row of said storage cells; and a plurality of data access ports;
the method comprising the steps of:
assigning each data access port to one of said sets of access control lines and corresponding data lines;
detecting a colliding data access request received at a second data access port that requests access to a row of storage cells currently being accessed by a data access request received at a first data access port;
in response to said detected colliding data access request assigning said set of access control lines and corresponding data lines currently assigned to said first data access port to said second data access port and following completion of said data access request received at said first data access port subsequently assigning said first data access port to said set of access control lines and corresponding data lines previously assigned to said second data access port.

11. The method according to claim 10, wherein said step of assigning said data access ports to one of said sets of access control lines and corresponding data lines is performed at a start of a data access cycle.

12. The method according to claim 11, comprising a step of storing an indicator value for each data access port indicating which of said sets of data lines and corresponding access control lines is currently assigned to said data access port.

13. The method according to claim 12, comprising a further step of in response to a data access request received at one of said data access ports updating said indicator value for said data access port in response to said collision detection circuitry indicating said data access request is a colliding data access request.

14. The method according to claim 13, wherein said memory is a dual port memory and comprises: first and second data access ports and first and second sets of access control lines and data lines; said method comprising
toggling a global indicator bit configured to toggle in response to detecting said colliding data access request, a first value of said global indicator bit indicating said first and second data access ports are to be assigned to said first and second sets of access control lines and corresponding data lines and a second value of said global indicator bit indicating said first and second data access ports are to be assigned to said second and first sets of access control lines and corresponding data lines respectively; and
in response to a data access request received at one of said data access ports updating said indicator value for said data access port with a current value of said global indicator bit and latching said value such that it is not updated again until after completion of said data access request.

15. The method according to claim 14, further comprising a step of:
detecting colliding data access requests received at two data access ports and whose data access cycles start within a predetermined time of each other and inhibiting said global indicator bit from toggling.

16. The method according to claim 10, said method further comprising:
selecting an access control line and corresponding data lines in dependence upon an indicator value stored in first latching circuitry in response to detecting that said data access is a colliding data access received a predetermined time after said data access that it collides with; and
selecting an access control line and corresponding data lines in dependence upon an inverted value of said indicator value stored in first latching circuitry in response to detecting that said data access is not a colliding data access.

17. The method according to claim 10, further comprising a step of:
detecting colliding data access requests received at two data access ports and whose data access cycles start within a predetermined time of each other and assigning both of said two data access ports to a predetermined access control line and corresponding data lines.

18. A multiport memory comprising:
an array of storage means for storing data, each storage means comprising storage circuitry and a plurality of access control means for isolating said storage circuitry from or connecting said storage circuitry to a data line, said memory comprising a plurality of sets of access control lines and corresponding data lines, each set of access control lines controlling one of said plurality of access control devices for each of said storage means, said data lines each being coupled to a column of said storage means and said access control lines each being coupled to a row of said storage means;
a plurality of data access ports;
access control means for assigning each data access port to one of said sets of access control lines and corresponding data lines;
said access control means comprising collision detection means for detecting a colliding data access request received at a second data access port that requests access to a row of storage means currently being accessed by a data access request received at a first data access port;
said access control means being responsive to said detected colliding data access request to assign said set of access control lines and corresponding data lines currently assigned to said first data access port to said second data access port and following completion of said data access request received at said first data access port to subsequently assign said first data access port to said set of access control lines and corresponding data lines previously assigned to said second data access port.

* * * * *